United States Patent
Akaki et al.

(10) Patent No.: US 10,932,389 B2
(45) Date of Patent: Feb. 23, 2021

(54) FRAME MEMBER ATTACHED TO MOBILE TERMINAL, OPERATION DEVICE FOR MACHINE INCLUDING FRAME MEMBER, AND COMPUTER PROGRAM FOR MOBILE TERMINAL

(71) Applicant: FANUC CORPORATION, Yamanashi (JP)

(72) Inventors: Seiya Akaki, Yamanashi (JP); Shougo Takahashi, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/546,300

(22) Filed: Aug. 21, 2019

(65) Prior Publication Data

US 2020/0084909 A1 Mar. 12, 2020

(30) Foreign Application Priority Data

Sep. 12, 2018 (JP) .............................. JP2018-170699

(51) Int. Cl.
*H05K 7/18* (2006.01)
*G06F 3/041* (2006.01)
*B25J 13/06* (2006.01)
*H05K 5/02* (2006.01)
*H05K 5/00* (2006.01)

(52) U.S. Cl.
CPC ............... *H05K 7/18* (2013.01); *B25J 13/06* (2013.01); *G06F 3/041* (2013.01); *H05K 5/0017* (2013.01); *H05K 5/0217* (2013.01)

(58) Field of Classification Search
CPC ........ G06F 3/041; H05K 7/18; H05K 5/0017; H05K 5/0217; B25J 13/06
See application file for complete search history.

(56) References Cited

U.S. PATENT DOCUMENTS

| | | | | |
|---|---|---|---|---|
| 6,266,685 B1* | 7/2001 | Danielson | ............. | G06F 1/1626 708/141 |
| 8,025,504 B2* | 9/2011 | Freeman | .................. | G09B 5/02 434/155 |
| 2012/0113228 A1* | 5/2012 | Konno | ................. | H04N 13/239 348/47 |
| 2012/0281345 A1* | 11/2012 | Masaki | ................. | G06F 1/1626 361/679.01 |

FOREIGN PATENT DOCUMENTS

| | | |
|---|---|---|
| JP | H985659 A | 3/1997 |
| JP | H11-54953 A | 2/1999 |
| JP | 2003-58278 A | 2/2003 |
| JP | 200391361 A | 3/2003 |
| JP | 2005122271 A | 5/2005 |
| JP | 2008233985 A | 10/2008 |

(Continued)

*Primary Examiner* — Muhammad N Edun
(74) *Attorney, Agent, or Firm* — Hauptman Ham, LLP

(57) ABSTRACT

A frame member is attached to a mobile terminal including a display of touch panel type. The frame member is formed in contact with the outer edge of the mobile terminal along the circumferential direction of the outer edge of the mobile terminal. On the front surface of the frame member, a recess part perceivable with a finger touch is formed at a position corresponding to a button image displayed on the display.

10 Claims, 17 Drawing Sheets

(56) References Cited

FOREIGN PATENT DOCUMENTS

| | | | |
|---|---|---|---|
| JP | 2010-257163 | A | 11/2010 |
| JP | 2011248437 | A | 12/2011 |
| JP | 3176588 | U | 6/2012 |
| JP | 2016-60018 | A | 4/2016 |
| JP | 2016-76782 | A | 5/2016 |
| JP | 2016206907 | A | 12/2016 |
| JP | 2017511633 | A | 4/2017 |
| JP | 2017107252 | A1 | 6/2017 |

* cited by examiner

FRAME MEMBER ATTACHED TO MOBILE TERMINAL, OPERATION DEVICE FOR MACHINE INCLUDING FRAME MEMBER, AND COMPUTER PROGRAM FOR MOBILE TERMINAL

RELATED APPLICATIONS

The present application claims priority of Japanese Application Number 2018-170699, filed Sep. 12, 2018, the disclosure of which is hereby incorporated by reference herein in its entirety.

BACKGROUND OF THE INVENTION

1. Field of the Invention

The present invention relates to a frame member attached to a mobile terminal, an operation device for a machine including a frame member, and a computer program for a mobile terminal.

2. Description of the Related Art

A machine such as a robot is controlled by a machine controller. It is known that an operation device is connected to the machine controller so as to enhance ease of operation for an operator of the controller. The operation device for the machine is formed so as to communicate with the machine controller via a communication line or a radio communication device. The operator can operate the machine while carrying the operation device. The use of a mobile terminal such as a tablet as operation device for the machine has been recently proposed.

The mobile terminal such as the tablet includes a touch panel display. The display can display information regarding the machine. For example, the operator can check a current machine status and a set value for operating a machine. Moreover, the display can display the images of buttons. By pressing the images of the buttons, the operator can operate the machine. Alternatively, by pressing the images of the buttons, the operator can input predetermined information. Thus, the operator can operate the machine and input information even at positions remote from the controller.

In the related art, devices for improving operability in the operations of the mobile terminal have been proposed. For example, a method of attaching a sheet to the surface of an operation panel is known, the sheet being attached so as to enhance the visibility of the positions of buttons on the operation panel (See, for example, Japanese Unexamined Patent Publication No. 11-54953A and Japanese Unexamined Patent Publication No. 2010-257163A).

Furthermore, a method of attaching a device including a keyboard or operation buttons to the mobile terminal in order to improve the operability of the mobile terminal is known (See, for example, Japanese Unexamined Patent Publication No. 2003-58278A and Japanese Utility Model Registration No. 3176588U). Moreover, a method of connecting a device having a predetermined function to the mobile terminal in order to provide additional function for the mobile terminal is known (See, for example, Japanese Unexamined Patent Publication No. 2016-76782A and Japanese Unexamined Patent Publication No. 2016-60018A).

SUMMARY OF THE INVENTION

When an operation device including a mobile terminal is connected to a controller, an operator can operate the operation device from various positions while viewing a machine status. For example, when the robot is operated manually, the position of a tool center point of the robot may be gradually moved in a predetermined direction while the position and posture of the robot is checked. In this case, in order to press a button image displayed on the display of the mobile terminal, it is necessary for the operator to confirm the position of the button image. However, since the operator views the screen of the display at each press of the button image, there is the problem that the operation takes a long time. For example, if an operation tool attached to the robot is to be moved slightly upward or downward, it is necessary for the operator to confirm the position of an upper button or the position of a lower button in each operation, resulting in a long operation time.

The operation device is preferably formed such that the operator can operate the machine while viewing the machine with minimum visual confirmation on the display. In other words, when the operator presses a predetermined image on the display, it is preferable to press the image while minimizing the viewing of the display.

A frame member for a mobile terminal according to an aspect of the present disclosure is configured to be attached to the mobile terminal including a display of touch panel type. The frame member is formed in contact with at least a part of the outer edge of the mobile terminal along the circumferential direction of the outer edge of the mobile terminal. The frame member has a front surface on the same side as the screen of the display, a rear surface on the opposite side from the front surface, an inner surface in contact with the mobile terminal, and an outer surface on the opposite side from the inner surface. A structure part being perceivable with a finger touch is formed on at least one of the front surface, the inner surface, and the outer surface, and formed at a position corresponding to a predetermined image displayed on the display. The structure part is constituted by at least one of a protrusion part formed on the front surface, a recess part formed on the front surface, a protrusion part formed on the outer surface, a recess part formed on the outer surface, a protrusion part projecting inward from the inner surface, and a recess part formed on the inner surface.

An operation device for a machine according to an aspect of the present disclosure includes a mobile terminal for operating the machine and a frame member attached to the mobile terminal. The mobile terminal includes a display of touch panel type. The frame member is formed in contact with at least a part of the outer edge of the mobile terminal along the circumferential direction of the outer edge of the mobile terminal. The frame member has a front surface on the same side as the screen of the display, a rear surface on the opposite side from the front surface, an inner surface in contact with the mobile terminal, and an outer surface on the opposite side from the inner surface. The mobile terminal is formed so as to display a predetermined image to be pressed by an operator on the display. A structure part that is perceivable with a finger touch is formed on at least one of the front surface, the inner surface, and the outer surface of the frame member, and formed at a position corresponding to an image displayed on the display. The structure part is constituted by at least one of a protrusion part formed on the front surface, a recess part formed on the front surface, a protrusion part formed on the outer surface, a recess part formed on the outer surface, a protrusion part projecting inward from the inner surface, and a recess part formed on the inner surface.

A computer program for a mobile terminal according to an aspect of the present disclosure determines a press on the screen of a display of touch panel type. A frame member is attached to the mobile terminal. The frame member is formed in contact with at least a part of the outer edge of the mobile terminal along the circumferential direction of the outer edge of the mobile terminal. The frame member has a front surface on the same side as the screen of the display, a rear surface on the opposite side from the front surface, an inner surface in contact with the mobile terminal, and an outer surface on the opposite side from the inner surface. A structure part that is perceivable with a finger touch is formed on at least one of the front surface, the inner surface, and the outer surface of the frame member. A computer program causes a computer to display a predetermined image to be pressed by an operator, the predetermined image being disposed at a position corresponding to the structure part formed on the frame member.

DETAILED DESCRIPTION

Referring to FIGS. 1 to 28, a frame member for a mobile terminal, an operation device for a machine including the frame member, and a computer program according to an embodiment will be described below. In the present embodiment, a robot and a hand will be illustrated as the machines operated by the operation device.

Figure 1:
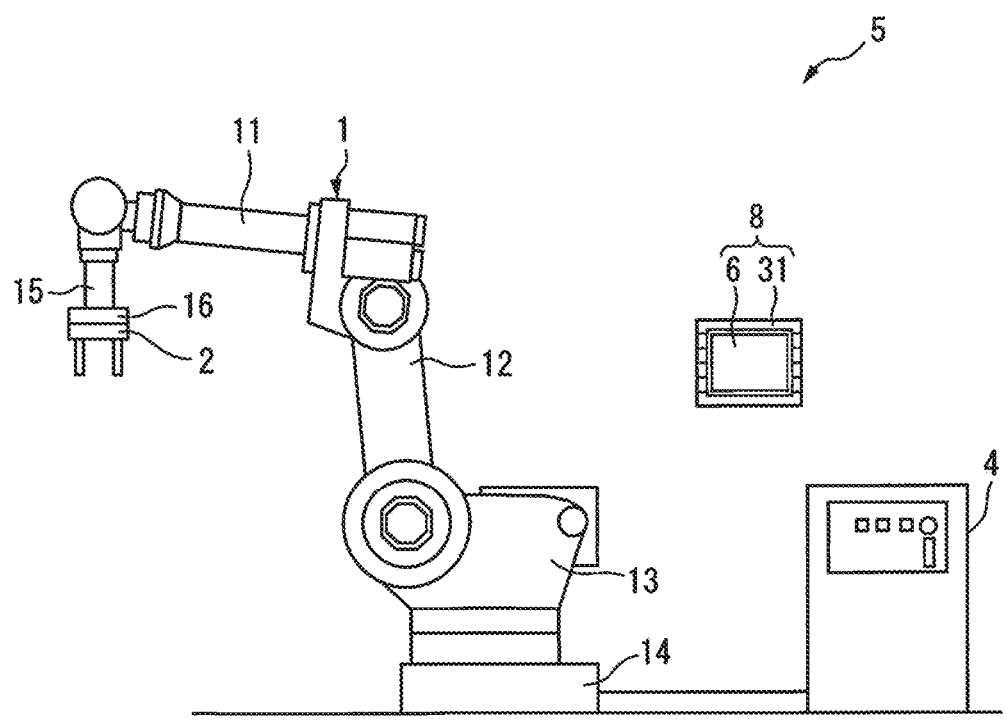
FIG. 1 is a schematic diagram of a robot device according to an embodiment.
Figure 2:
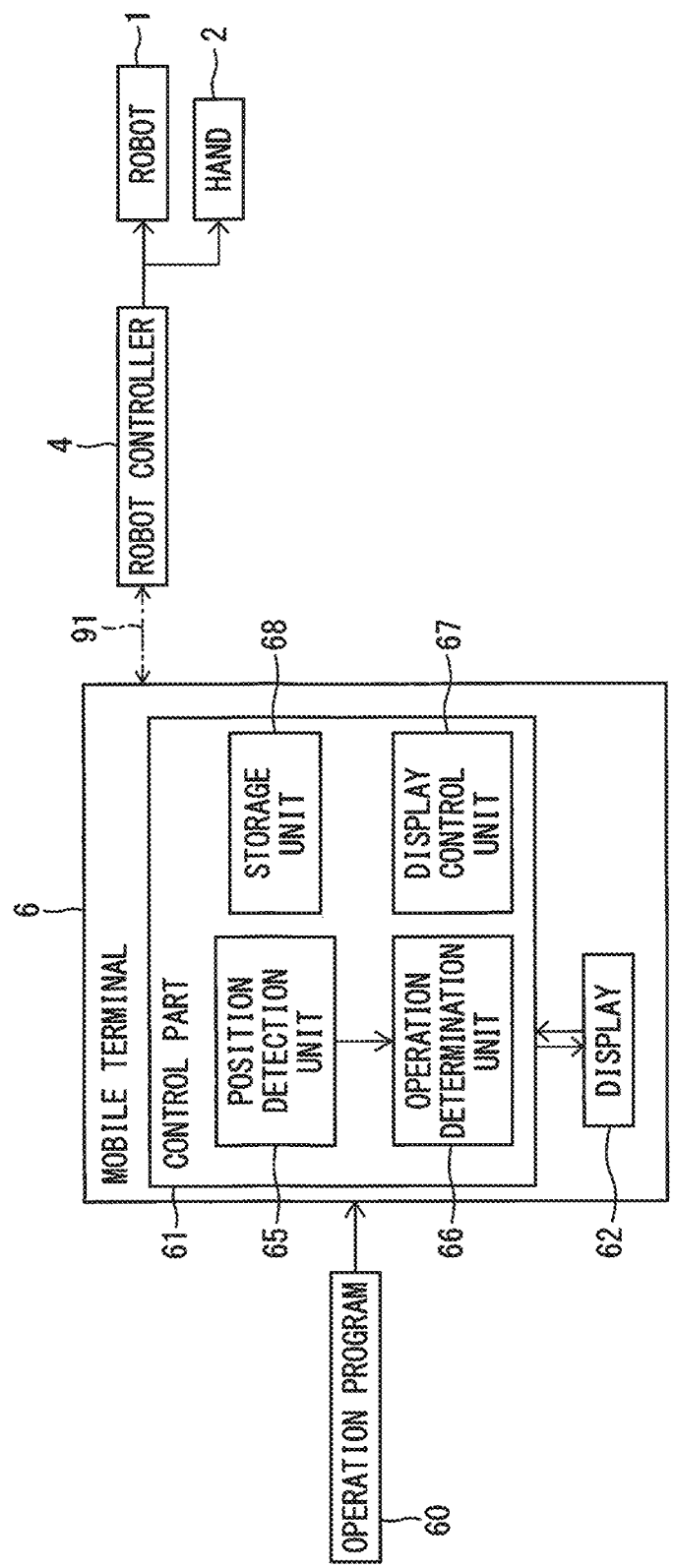
FIG. 2 is a block diagram of the robot device including a first frame member according to the embodiment.

FIG. 1 is a schematic diagram of a robot device according to the present embodiment. FIG. 2 is a block diagram of the robot device according to the present embodiment. Referring to FIGS. 1 and 2, a robot device 5 includes a hand 2 as an end effector for gripping a workpiece and a robot 1 that moves the hand 2. The robot 1 of the present embodiment is an articulated robot including a plurality of joints.

The robot 1 includes a base part 14 and a rotation base 13 supported by the base part 14. The base part 14 is fixed to an installation surface. The rotation base 13 rotates relative to the base part 14. The robot 1 includes an upper arm 11 and a lower arm 12. The lower arm 12 is supported by the rotation base 13 via a joint. The upper arm 11 is supported by the lower arm 12 via a joint. The robot 1 includes a wrist 15 connected to one end of the upper arm 11. The wrist 15 is supported by the upper arm 11 via a joint. The hand 2 is fixed to a flange 16 of the wrist 15.

The robot 1 of the present embodiment includes a robot drive device that drives each of components such as the upper arm 11. The robot drive device of the present embodiment includes drive motors that drive the upper arm 11, the lower arm 12, the rotation base 13, and the wrist 15. The position and posture of the robot 1 can be changed by changing the orientations of the components of the robot 1 at the joints.

The robot device includes a robot controller 4 that controls the robot 1 and the hand 2. The robot controller 4 acts as a machine controller. The robot controller 4 includes an arithmetic processing device (computer) having a central processing unit (CPU) as a processor. The arithmetic processing device includes RAM (Random Access Memory) and RPM (Read Only Memory) that are connected to the CPU via a bus. The robot 1 and the hand 2 are connected to the robot controller 4 via communication line.

The robot device 5 includes an operation device 8 connected to the robot controller 4 via a communication device. The operation device 8 includes a mobile terminal 6 and a first frame member 31 attached to the mobile terminal 6. In order to generate an operation program for the robot 1 and the hand 2, the operation device 8 of the present embodiment acts as a teach pendant for setting the position and posture of the robot 1.

The mobile terminal 6 of the present embodiment includes a display 62, of touch panel type. A display of an arbitrary type such as a resistive film type, an electrostatic capacitance type, or a surface-acoustic-wave type may be employed as the display 62 of touch panel type. The display 62 of the present embodiment has the function of displaying an operation screen for operating the robot 1 and the hand 2 and a display screen for displaying information on the robot 1 and the hand 2.

The display 62 is formed so that machine information such as the states of the robot 1 and the hand 2 can be displayed. The display 62 also acts as an operation part for input by an operator. The display 62 is formed so as to display button images for operating the robot 1 and the hand 2. Alternatively, the display 62 may be formed so as to display button images for inputting set values of the machine. The display 62 is formed so as to detect a pressed position in response to a finger touch on the screen. The display 62 is formed so as to determine that the button image is pressed when the button image displayed on the screen is pressed by the finger.

The mobile terminal 6 of the present embodiment is a tablet type computer. The mobile terminal is not limited to this configuration. Any mobile terminal including a display of touch panel type may be used. For example, the mobile terminal may be smartphone, etc.

The mobile terminal 6 includes a control part 61. The control part 61 includes an arithmetic processing device (computer) having a CPU as a processor. The arithmetic processing device includes RAM, etc. connected to the CPU via a bus. The control part 61 includes a storage unit 68 that stores arbitrary information regarding machine operations. The storage unit 68 can be constituted by a storage medium capable of storing information such as a volatile memory, a nonvolatile memory, or a hard disk. The control part 61 includes a display control unit 67 that controls an image displayed on the display 62.

The control part 61 includes a position detection unit 65 that detects the position at which the operator presses the screen of the display 62 by using the finger. The control part 61 includes an operation determination unit 66 that determines an operation performed by the operator on the display 62 based on the output of the position detection unit 65. For example, the position detection unit 65 detects that a press of the button image has been cancelled after the button image displayed on the display 62 has been pressed. In this case, the operation determination unit 66 can determine that the operator has pressed the button image.

Each of the display control unit 67, the position detection unit 65, and the operation determination unit 66 corresponds to the processor driven according to the operation program 60. The processor functions as respective units by reading the operation program 60 and executing control as defined in the operation program 60.

The mobile terminal 6 of the present embodiment is formed so as to cable of wirelessly communicating with the robot controller 4 as indicated by arrow 91. The control part 61 receives information regarding operations from the robot controller 4. Moreover, the control part 61 transmits a command regarding the operation performed on the display 62 by the operator to the robot controller 4. The robot controller 4 drives the robot 1 and the hand 2 in response to the command from the control part 61. For the wireless communication, a method based on (registered trademark), Bluetooth (registered trademark), or the like can be employed.

In the present embodiment, though the mobile terminal 6 and the robot controller 4 are connected to each other via a wireless communication device, the embodiment is not limited to this. The mobile terminal 6 and the robot controller 4 may be formed so as to communicate with each other via a communication line.

Figure 3:
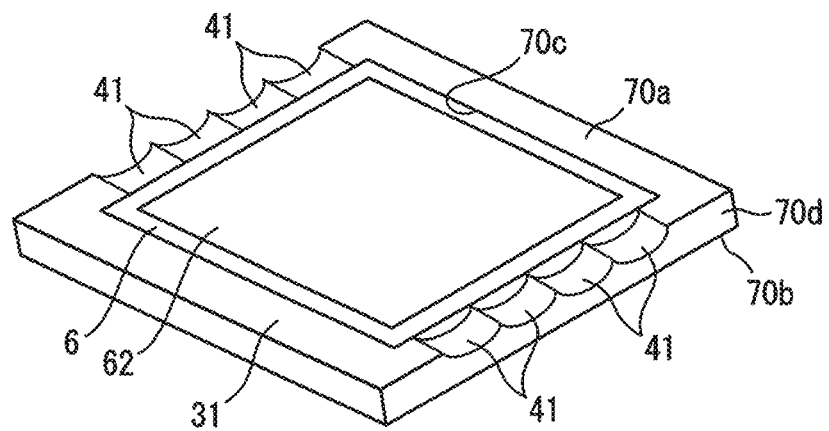
FIG. 3 is a perspective view of a first frame member and a mobile terminal according to the embodiment.
Figure 4:
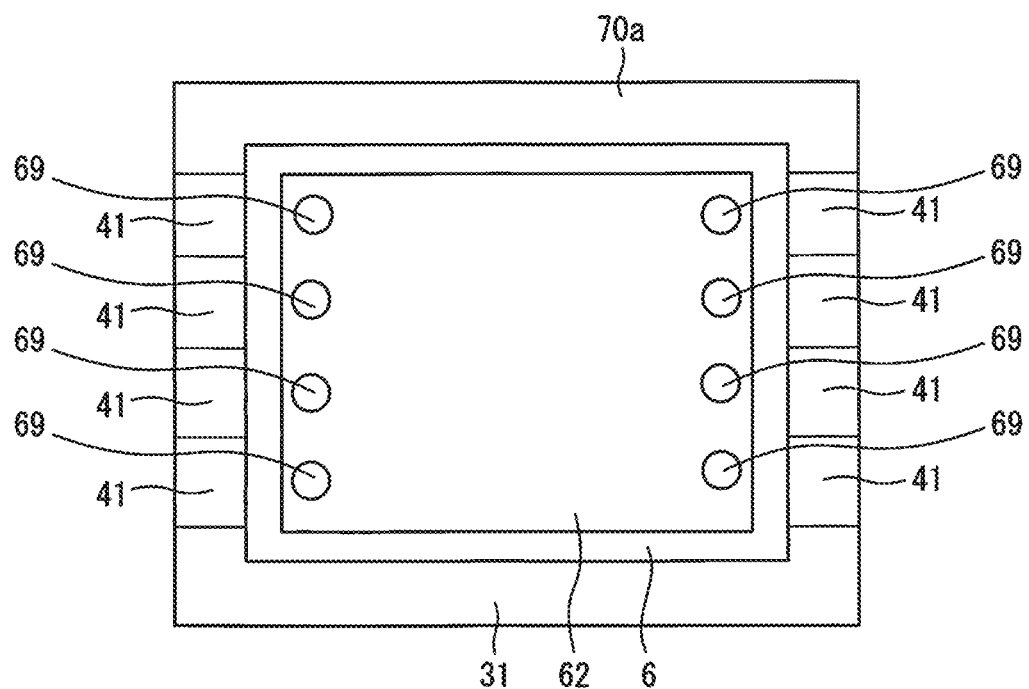
FIG. 4 is a plan view of the first frame member and the mobile terminal.
Figure 5:
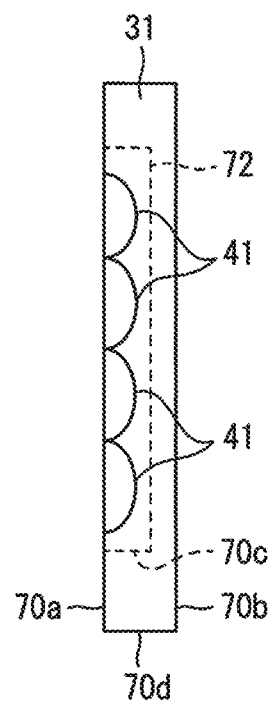
FIG. 5 is a side view of the first frame member.

FIG. 3 is a perspective view of the first frame member and the mobile terminal according to the present embodiment. FIG. 4 is a plan view of the first frame member and the mobile terminal according to the present embodiment. FIG. 5 is a side view of the first frame member according to the present embodiment. The frame member of the present embodiment is an attachment added to the mobile terminal which acts as an auxiliary device of the mobile terminal. In other words, the operation device of the present embodiment includes the mobile terminal and the auxiliary device.

Referring to FIGS. 3 to 5, the first frame member 31 is attached to the mobile terminal 6. The mobile terminal and the frame member of the present embodiment are formed in a rectangular parallelepiped shape. The first frame member 31 is an elastic member made of rubber, resin, or the like. The frame member 31 has a dent part 72 for arrangement of the mobile terminal 6. The dent part 72 is formed so as to correspond to the exterior shape of the mobile terminal 6. The operator presses the mobile terminal 6 into the dent part 72 of the frame member 31, whereby the mobile terminal 6 is secured in the frame member 31.

The method for securing the mobile terminal in the frame member is not limited to this embodiment, and any arbitrary method can be used. For example, the mobile terminal may be secured in the frame member with an adhesive sheet. Alternatively, the mobile terminal may be secured in the frame member with fastening members such as bolts. Furthermore, if it is not necessary to remove the mobile terminal from the frame member, the mobile terminal may be secured in the frame member with an adhesive.

The first frame member 31 has a shape that is in contact with the entirety of the outer edge of the mobile terminal 6 in the circumferential direction of the outer edge of the mobile terminal 6. The frame member 31 has a front surface 70a on the same side as the screen of the display 62. The front surface 70a is the front side of the frame member 31. The frame member 31 has a rear surface 70b on the opposite side from the front surface 70a, an inner surface 70c in contact with the mobile terminal 6, and an outer surface 70d on the opposite side from the inner surface 70c. The inner surface 70c corresponds to the side surface of the dent part 72.

The mobile terminal 6 is formed so as to display a predetermined image on the screen of the display 62. The display 62 of the present embodiment is formed so as to display button images 69 for operation of the robot 1 and the hand 2 by the operator. The button images 69 are displayed on the end parts of the screen of the display 52.

The frame member of the present embodiment has structure parts formed at positions corresponding to the button images 69 displayed on the display 62. In particular, the frame member has a main body formed in contact with at least a part of the outer edge of the mobile terminal and structure parts formed on the main body. The structure parts are formed so as to be perceivable with a finger touch. The structure parts act as position specifying parts with which positions can be specified with a finger touch. The first frame member 31 has a plurality of recess parts 41 formed as the structure parts on the front surface 70a. The recess parts 41 are formed so as to be recessed from the front surface 70a. The recess part 41 has a shape that is formed according to a predetermined rule. The first frame member 31 has recess parts 41 that are identical in shape. The recess part 41 is formed to be arc-shaped in cross section. Each of the recess parts 41 extends from the outer surface 70d to the inner surface 70c. Each of the recess parts 41 is formed so as to extend from the edge of the first frame member 31 toward the screen of the display 62.

Each of the recess parts 41 is formed at a position corresponding to the button image 69. One recess part 41 is formed with respect to one button image 69. The button images 69 are displayed at regular intervals. The recess parts 41 are formed at regular intervals. The recess parts 41 are formed on the sides of the corresponding button images 69. In other words, the button images 69 are displayed near the corresponding recess part 41. In the example of FIG. 4, the display 62 displays eight button images 69 on the left end part and the right end part of the screen of the display 62. Eight recess parts 41 are formed on the front surface 70a of the first frame member 31 so as to correspond to the respective positions of the button images 69.

When the robot 1 and the hand 2 are operated by using the mobile terminal 6 to which the first frame member 31 is attached, the operator presses a desired button image 69. The operator can select the recess part 41 at a desired position while touching the recess parts 41 with a finger. The button image 69 corresponding to the recess part 41 is displayed near the recess part 41. The operator can press a desired button image 69 by moving a finger in the extending direction of the recess part 41. For example, the operator selects the second recess part 41 from the top with a touch of the thumb of the right hand. The operator then presses one end part of the screen of the display 62 to the left of the recess part 41, thereby pressing the second button image 69 from the top.

Thus, the operator can select a desired recess part 41 by tactile feeling of the finger and press the button image 69 on inner side of the recess part 41. This enables the operator to press a desired button image 69 without viewing the screen of the display 62. If the position of the recess part 41 cannot be recognized, the operator may confirm the recess part 41 corresponding to the image 69 of the display 62.

Since the frame member of the present embodiment has the structure part that is perceivable with a finger touch, the operator can recognize the position of a finger itself on the frame member. Thus, the operation device can be operated without viewing of the display. Alternatively, the number of times for viewing the display can be reduced. As a result, the operator can operate the operation device in a short time. Moreover, in the present embodiment, the functions described above can be easily added to a mobile terminal by attaching the frame member to the mobile terminal.

The recess parts 41 of the present embodiment are arc-shaped in cross section. Thus, the operator can easily determine the positions of the recess parts 41. The button images 69 of the present embodiment are displayed on lines that pass through the deepest position of the recess part 41 and are parallel with the extending directions of the recess parts 41. With this configuration, by moving a finger in the extending direction of the recess part 41, the operator can press a desired button image. As a result, operation errors made by the operator can be suppressed.

Though the recess parts of the first frame member are arc-shaped in cross section, the shapes of the recess parts are not limited thereto. The recess parts may have any cross-sectional shape. For example, the recess part may have a shape that is a part of quadrangle or a part of triangle in cross section.

The frame member of the present embodiment can be removed from the mobile terminal. For example, when a plurality of types of machines are installed and mobile terminals are connected to the controllers of the machines, the mobile terminals are changed by using one frame member so as to operate the plurality of machines. Alternatively, when a mobile terminal is non-functional, the mobile terminal can be exchanged with another mobile terminal having substantially the same exterior shape.

As a comparative example for recognizing the positions of button images displayed on the display, a sheet having protrusion parts may be attached to the screen of the display. For example, a transparent sheet having protrusion parts corresponding to the button images can be attached to the screen of the display. The operator can recognize the positions of the button images based on the positions of the protrusion parts. In this method, however, the protrusion parts of the sheet on the screen may reduce the visibility of the images when the display displays the images other than the button. For example, when machine information is displayed on the display of the mobile terminal, the protrusion parts of the sheet may obscure the machine information.

The sheet attached when the mobile terminal is used can be removed after use of the mobile terminal. However, since this method requires the attachment and detachment of the sheet, there is the problem that it takes a long operation time. Furthermore, the sheet may be contaminated and lose adhesion to the display.

Conversely, since the frame member of the present embodiment does not cover the screen of the display, when arbitrary information other than the button images is displayed on the display, the display is not obscured. Moreover, contamination does not interfere with the attachment of the frame member of the present embodiment to the mobile terminal, and thus, the frame member can be used any number of times.

Figure 6:
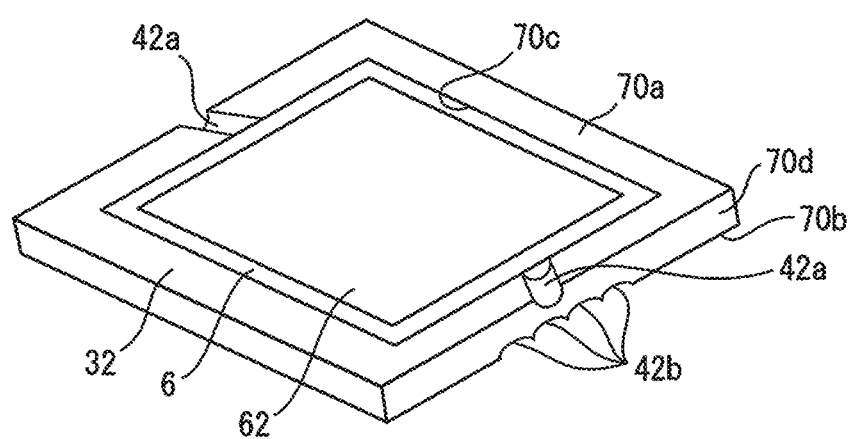
FIG. 6 is a perspective view of a second frame member and the mobile terminal according to the embodiment.
Figure 7:
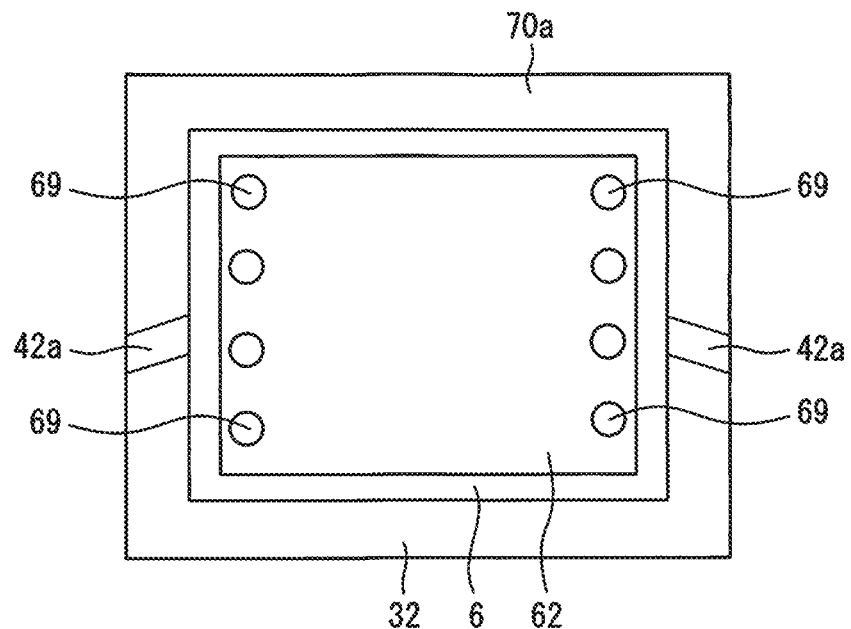
FIG. 7 is a plan view of the second frame member and the mobile terminal.
Figure 8:
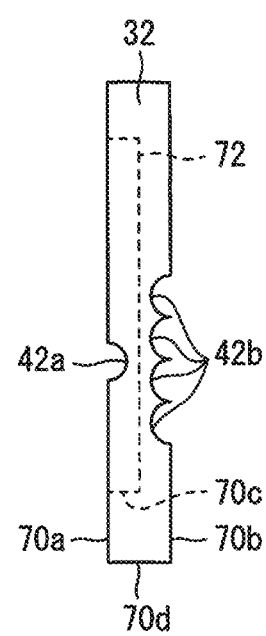
FIG. 8 is a side view of the second frame member.
Figure 9:
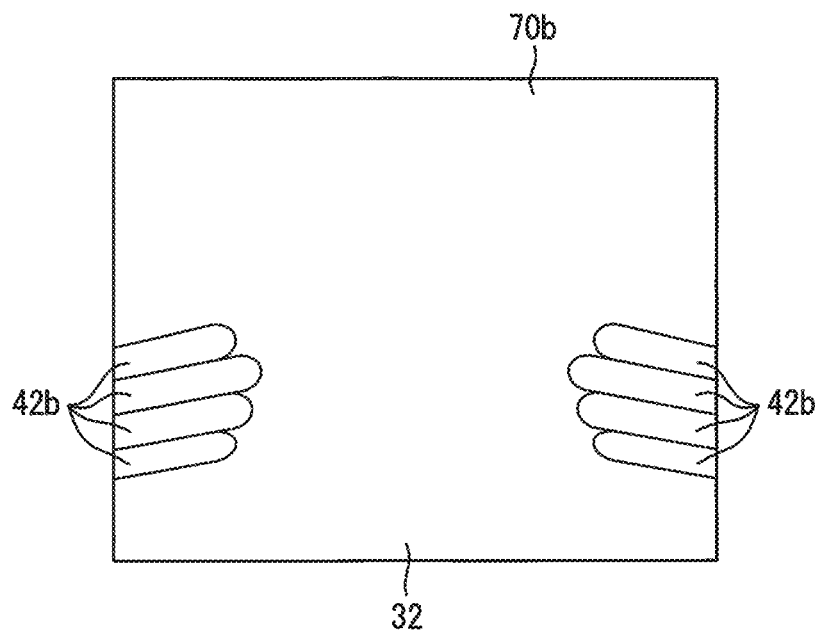
FIG. 9 is a rear view of the second frame member.

FIG. 6 is a perspective view of a second frame member and the mobile terminal according to the present embodiment. FIG. 7 is a plan view of the second frame member and the mobile terminal according to the present embodiment. FIG. 8 is a side view of the second frame member according to the present embodiment. FIG. 9 is a rear view of the second frame member according to the present embodiment. Referring to FIGS. 6 to 9, the second frame member 32 has recess parts 42a as structure parts on the front surface 70a. A single recess part 42a is formed on each frame of the surface 70a. A recess part 42a is formed on each of the left frame and the right frame.

The display 62 displays a plurality of the button images 69. The button images 69 are displayed on the left end part and the right end part of the screen of the display 62. A recess part 42a is formed at a position corresponding to the second button image 69 from the bottom. The recess part 42a extends so as to be inclined with respect to the extending direction of the frame of the second frame member 32. The recess part 42a extends from an outer surface 70d to an inner surface 70c. Moreover, the recess parts 42a are arc-shaped in cross section.

The second frame member 32 has recess parts 42b formed as the structure parts on a rear surface 70b. A plurality of recess parts 42b are formed on the second frame member 32. The plurality of recess parts 42b are formed so as to correspond to the shapes of index fingers, middle fingers, medicinal fingers, and little fingers that are placed when the operator grips the rear surface of the second frame member 32.

The operator places fingers into the recess parts 42b on the rear surface 70b, whereby the gripping position of the operator is secured. In other words, the position of a hand is secured with respect to the mobile terminal 6. The operator can recognize the position of the display 62 based on the position of the hand. By placing fingers into the recess parts 42b on the rear surface 70b, the second frame member 32 can be stably gripped. The recess parts 42a formed on the front surface 70a can facilitate the recognition of the positions of thumbs with respect to the display 62.

On the front surface and the rear surface of the frame member, any number of structure parts can be formed. Furthermore, the structure part having any shape can be formed. The structure part that is perceivable with a finger touch may be formed also on the inner surface 70c and the outer surface 70d of the frame member. Examples thereof will be discussed later.

Figure 10:
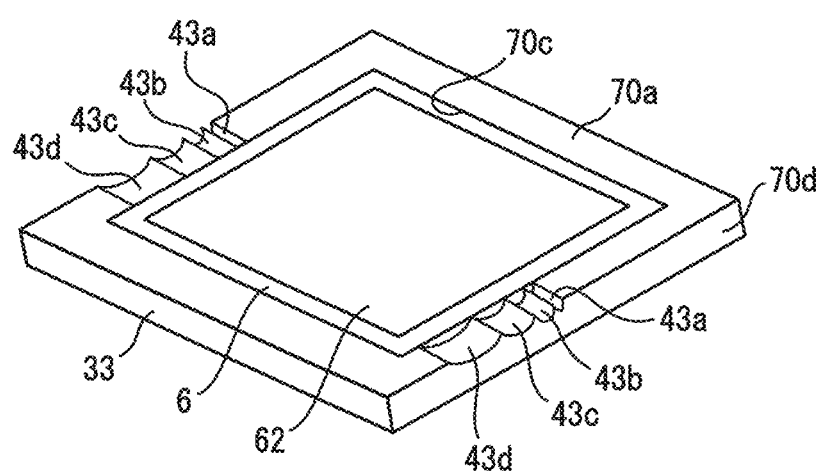
FIG. 10 is a perspective view of a third frame member and the mobile terminal according to the embodiment.
Figure 11:
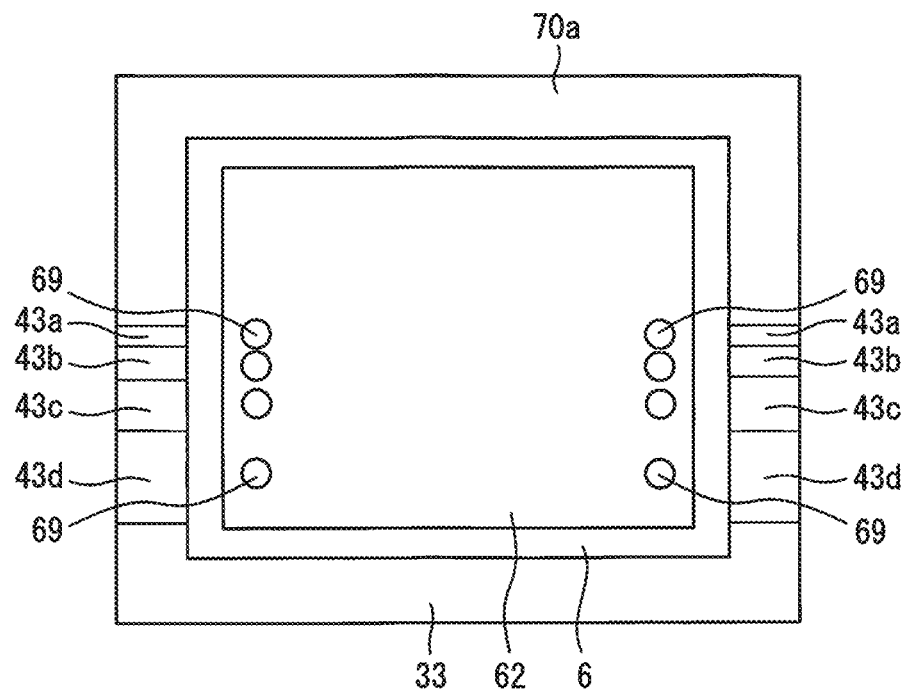
FIG. 11 is a plan view of the third frame member and the mobile terminal.
Figure 12:
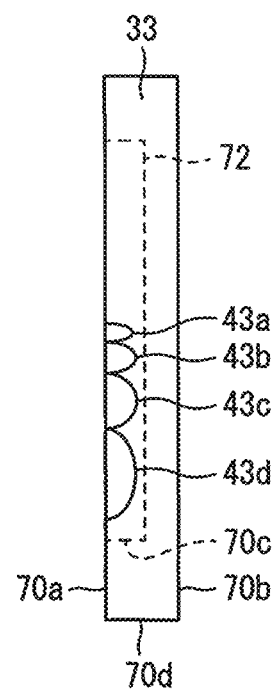
FIG. 12 is a side view of the third frame member.

FIG. 10 is a perspective view of a third frame member and the mobile terminal according to the present embodiment. FIG. 11 is a plan view of the third frame member and the mobile terminal according to the present embodiment. FIG. 12 is a side view of the frame member according to the present embodiment. Referring to FIGS. 10 to 12, recess parts 43a to 43d are formed as structure parts on a front surface 70a of the third frame member 33. The plurality of recess parts 43a to 43d are formed so as to have different shapes in accordance with the positions of the button images 69 displayed on the display 62. On the third frame member 33, the recess parts 43a to 43d are formed so as to gradually decrease in width along the extending direction of the frame. The intervals between center lines along the extending directions of the recess parts 43a to 43d are gradually reduced according to the positions of the button images 69 displayed on the display 62.

The display 62 displays the button images 69 at positions corresponding to the positions of the recess parts 43a to 43d. The recess parts 43a to 43d are formed on the left side and the right side of the screen of the display 62. Accordingly, the display 62 displays the button images 69 on the left end part and the right end part of the screen. The display 62 displays a single button image 69 for each recess part 43a to 43d.

The plurality of recess parts 43a to 43d have different shapes in the third frame member 33. Accordingly, the operator can recognize the recess part which the operator touches by the tactile feeling when one recess part is touched. The operator can easily select a recess part corresponding to a desired button image 69. Thereafter, the operator can press the desired button image 69 by pressing the position of a finger after moving a finger toward the center of the display 62.

Alternatively, the plurality of recess parts may be formed such that the intervals between the recess parts gradually change. For example, the plurality of recess parts may have identical shapes and may be formed such that the intervals between the recess parts gradually decrease. According to this configuration, the operator can easily select the recess part corresponding to the desired button image.

The plurality of recess parts can be formed according to a predetermined rule. The operator can easily recognize positions on the frame member. For example, when recess parts having the same shape are formed at regular intervals, the recess part at a desired position may be selected by touching the plurality of recess parts from the upper side to the lower side. In the third frame member 33, the operator can easily recognize the positions of the recess parts by touching the recess parts. As a result, the operation time can be shortened.

Figure 13:
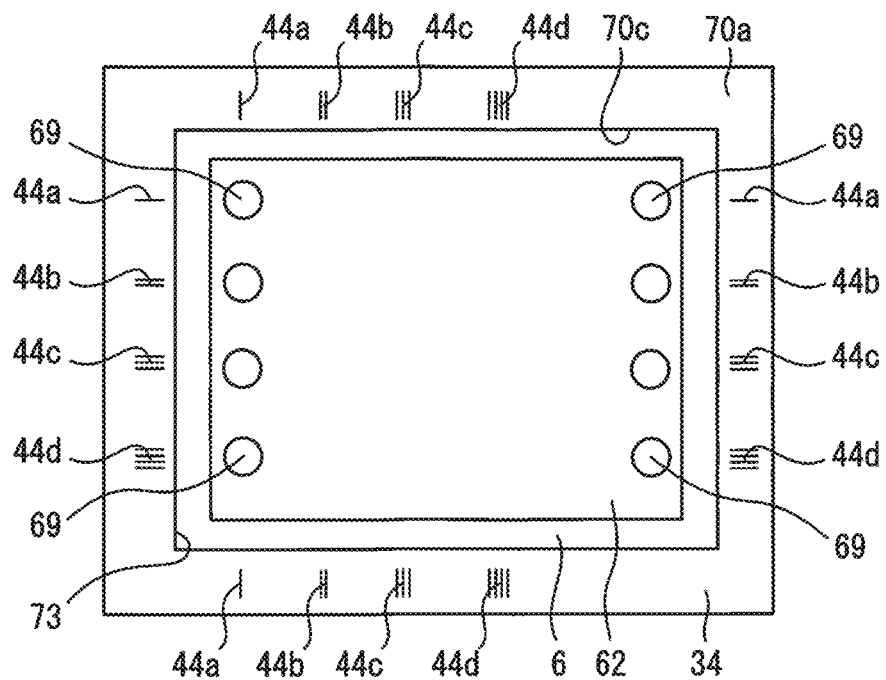
FIG. 13 is a plan view of a fourth frame member and the mobile terminal according to the embodiment.

FIG. 13 is a plan view of a fourth frame member and the mobile terminal according to the present embodiment. In the first frame member 31, the second frame member 32, and the third frame member 33 described above, the recess parts are formed as structure parts perceivable with a finger touch. The structure parts are not limited to these configurations. The structure part may be a protrusion part formed on the frame member.

Protrusion parts 44a to 44d are formed on a front surface 70a of a fourth frame member 34. The plurality of protrusion parts 44a to 44d have shapes that are different from each other. The protrusion parts 44a to 44d are parts projecting from the front surface 70a. The protrusion part 44a is constituted by a single linear projecting part. The protrusion part 44b is constituted by two linear projecting parts. The protrusion part 44c is constituted by three linear projecting parts. The protrusion part 44d is constituted by four linear projecting parts. Thus, the protrusion parts 44a to 44d are formed such that the number of projecting parts increases one-by-one along the extending direction of the frame. The protrusion parts 44a to 44d of the fourth frame member 34 are formed according to a predetermined rule.

The protrusion parts 44a to 44d are formed so as to correspond to the positions of the button images 69 displayed on the display 62. Also in the case of the protrusion parts formed as structure parts, the operator can easily press desired one of the button images.

In the example of FIG. 13, the protrusion parts 44a to 44d have shapes that are different from each other, but the embodiment is not limited to this. The protrusion parts may be identical in shape. The shape of the protrusion part is not limited to the linear projecting part. Any shape may be used instead. For example, the protrusion parts may be formed as projecting dots. Alternatively, the protrusion parts may include projecting parts that are shaped like symbols or numbers in a plan view.

In the fourth frame member 34, the protrusion parts 44a to 44d are formed on the left frame and the right frame and the protrusion parts 44a to 44d are formed on the upper frame and the lower frame in a plan view. When the machine is operated by the mobile terminal, the machine may be operated by switching displayed images. The display 62 shown in FIG. 13 can display the button images on the upper end part and the lower end part of the screen. In this case, by gripping the upper frame and the lower frame, the operator can easily press the button images displayed at positions corresponding to the protrusion parts 44a to 44d formed on the upper frame and the lower frame.

In the first frame member 31, the second frame member 32, and the third frame member 33 described above, though the mobile terminal 6 is fit into the dent part 72, the embodiment is not limited to this. A hole passing through the frame may be formed on the frame member, and the mobile terminal 6 may be arranged therein. The fourth frame member 34 has a through hole 73 for arrangement of the mobile terminal 6. The side surface of the through hole 73 corresponds to the inner surface 70c of the frame member.

Figure 14:
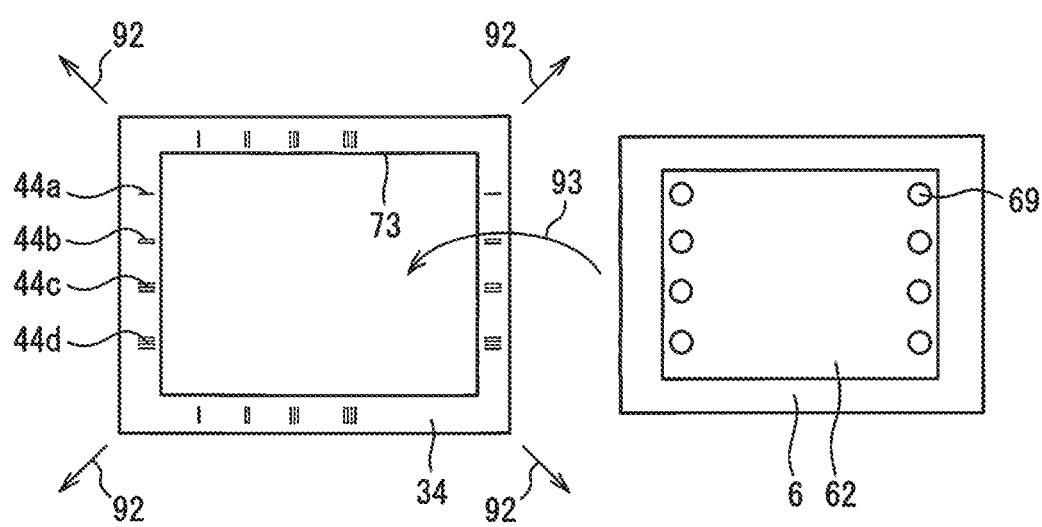
FIG. 14 is an explanatory drawing when the mobile terminal is secured in the fourth frame member.
Figure 15:
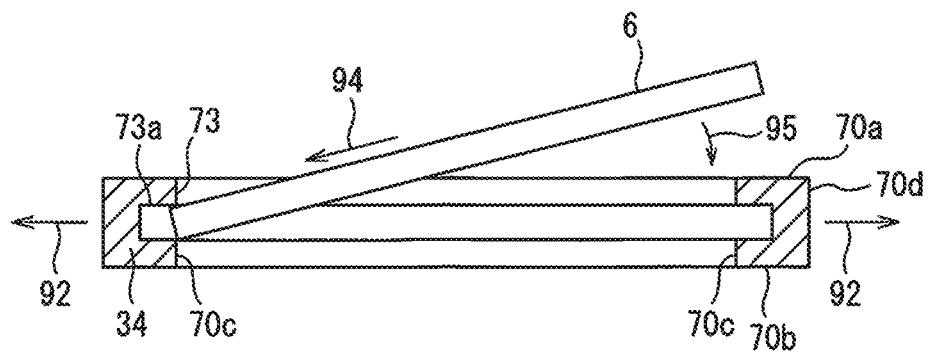
FIG. 15 is a schematic partial cross-sectional view when the mobile terminal is secured in the fourth frame member.

FIG. 14 is a schematic plan view when the mobile terminal is secured in the fourth frame member. FIG. 15 is a schematic cross-sectional view when the mobile terminal is secured in the fourth frame member. Referring to FIGS. 14 and 15, the fourth frame member 34 of the present embodiment is made of an expandable member. The fourth frame member 34 is made of, for example, rubber. Thus, after the frame member 34 is pulled outward as indicated by arrows 92, the mobile terminal 6 can be placed into the through hole 73 as indicated by arrow 93.

A groove 73a is formed in the inner surface 70c. The groove 73a is formed so as to mate with the end part of the mobile terminal 6. As indicated by arrow 94, one end part of the mobile terminal 6 is inserted into the groove 73a in a state in which the frame member 34 is pulled in the directions Indicated by the arrows 92. Thereafter, as indicated by arrow 95, the other end part of the mobile terminal 6 is inserted into the groove 73a. The fourth frame member 34 is then returned to the original state, whereby the end parts of the mobile terminal 6 mate with the groove 73a. As described above, the mobile terminal may be arranged in the through hole formed in the frame member. The rest of the configuration, action, and effects of the fourth frame member are similar to those of the first frame member through the third frame member.

Figure 16:
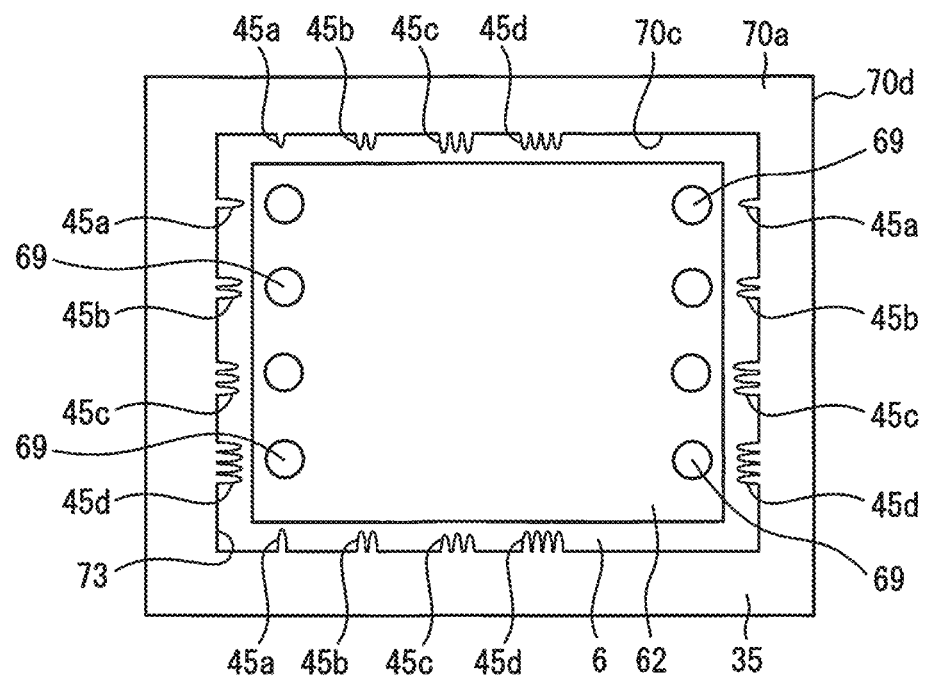
FIG. 16 is a plan view of a fifth frame member and the mobile terminal according to the embodiment.

FIG. 16 is a plan view of a fifth frame member and the mobile terminal according to the present embodiment. In a fifth frame member 35, protrusion parts 45a to 45d are formed as structure parts perceivable with a finger touch, and the protrusion parts 45a to 45d are formed so as to project inward from an inner surface 70c. The plurality of protrusion parts 45a to 45d are formed so as to partially cover the display 62. The protrusion parts 45a to 45d are disposed on the part of the bezel (the edge portion in which an image is not displayed) of the display 62. The plurality of protrusion parts 45a to 45d are formed at positions corresponding to the button images 69 displayed on the display 62.

The protrusion part 45a is constituted by a single projecting part that projects from the inner surface 70c. The protrusion part 45b is constituted by two projecting parts that project from the inner surface 70c. The protrusion part 45c is constituted by three projecting parts that project from the inner surface 70c. The protrusion part 45d is constituted by four projecting parts that project from the inner surface 70c. Thus, the plurality of protrusion parts 45a to 45d are formed such that the number of projecting parts increases one-by-one in a direction along which the convex portions 45a to 45d are aligned. In the fifth frame member 35, the plurality of the protrusion parts 45a to 45d are formed so as to have shapes which differ from each other according to a predetermined rule.

When the mobile terminal 6 is secured in the fifth frame member 35, for example, a through hole 73 can be formed in the fifth frame member 35. The mobile terminal 6 can be secured in the fifth frame member 35 by inserting the mobile terminal 6 from the side opposite to the side on which the protrusion parts 45a to 45d are formed. The rest of the configuration, action, and effects of the fifth frame member are similar to those of the first frame member through the fourth frame member.

Figure 17:
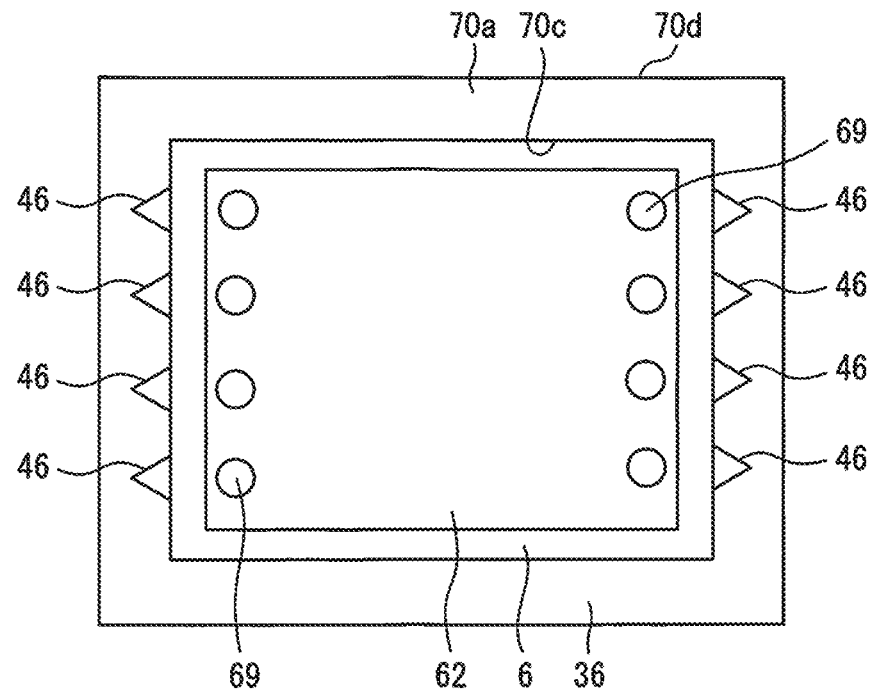
FIG. 17 is a plan view of a sixth frame member and the mobile terminal according to the embodiment.

FIG. 17 is a plan view of a sixth frame member and the mobile terminal according to the present embodiment. The structure parts formed on the inner surface of the frame member are not limited to protrusion parts, but may be recess parts. The sixth frame member 36 has recess parts 46 formed on an inner surface 70c. The recess parts 46 are formed at positions corresponding to the button images 69. Each of the recess parts 46 has a triangular shape in cross section. In the sixth frame member 36, the recess parts that have identical shape are formed at regular intervals. The rest of the configuration, action, and effects of the sixth frame member are similar to those of the first frame member through the fifth frame member.

Figure 18:
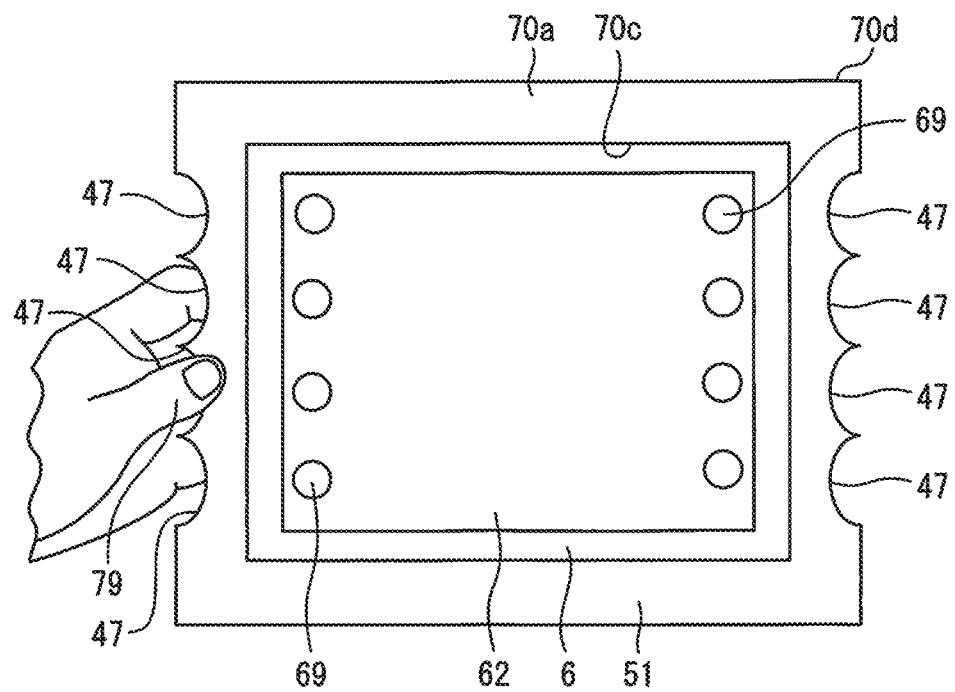
FIG. 18 is a plan view of a seventh frame member and the mobile terminal according to the embodiment.

FIG. 18 is a plan view of a seventh frame member and the mobile terminal according to the present embodiment. Recess parts and protrusion parts to be formed as structure parts on the frame member can be formed on the outer surface of the frame member. In the example of FIG. 18, recess parts 47 are formed on an outer surface 70d of the seventh frame member 51. The recess parts 47 are formed at positions corresponding to the button images 69 displayed on the display 62. The recess parts 47 are formed so as to reach the front surface 70a. In the example of FIG. 18, the recess parts 47 are formed so as to extend from the front surface 70a to the rear surface 70b.

In the case in which structure parts are formed on the outer surface of the frame member, by touching the structure parts with a finger, the operator can recognize the position of the finger on the frame member. The operator can select a desired recess part 47 with a touch of a finger 79 and press the button image 69 on inner side of the recess part 47. The operator can press a desired button image 69 without viewing the screen of the display 62. When the recess parts 47 are formed on the outer surface 70d, the plurality of recess parts 47 may have different shapes and intervals like the third frame member (FIG. 11 and FIG. 12). The rest of the configuration, action, and effects of the seventh frame member are similar to those of the first frame member through the sixth frame member.

Figure 19:
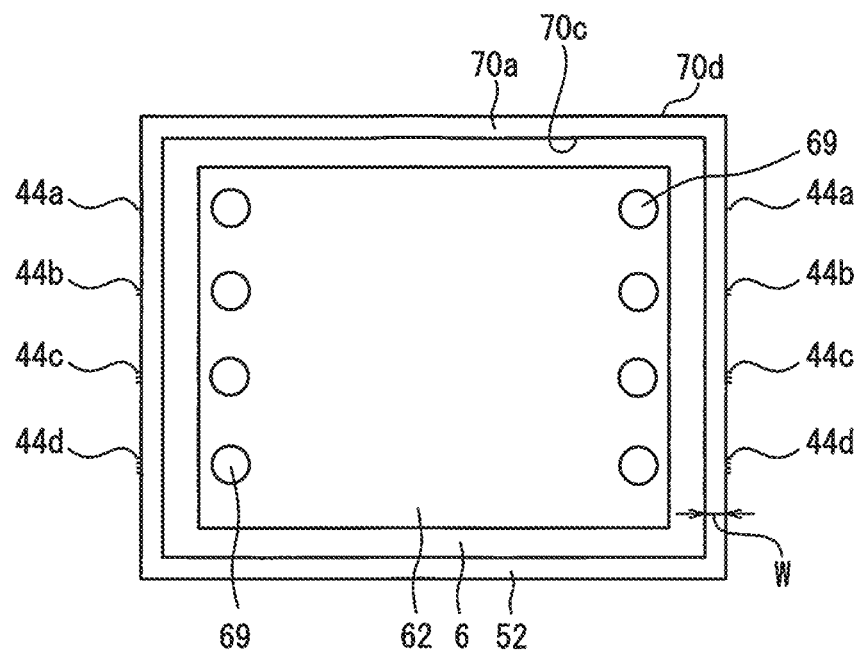
FIG. 19 is a plan view of an eighth frame member and the mobile terminal according to the embodiment.
Figure 20:
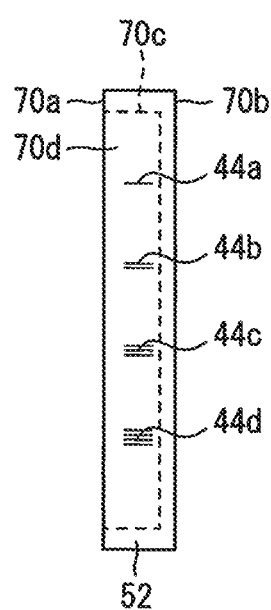
FIG. 20 is a side view of the eighth frame member.

FIG. 19 is a plan view of an eighth frame member and the mobile terminal according to the present embodiment. FIG. 20 is a side view of the eighth frame member according to the present embodiment. The eighth frame member 52 has protrusion parts 44a to 44d formed on an outer surface 70d. The frame member 52 is preferably formed so as to minimize the width W of the front surface 70a corresponding to the outer surface 70d on which the protrusion parts 44a to 44d are formed. In other words, the frame member 52 is preferably formed such that a portion in contact with the outer edge of the mobile terminal 6 is thin. The width W of the front surface 70a is, example, 2 cm or less. More preferably, the width W of the front surface 70a is 1 cm or less. The protrusion parts 44a to 44d are formed at positions corresponding to the button images 69 displayed on the display 62.

In the case in which the protrusion parts 44a to 44d are formed on the outer surface 70d of the frame member 52, by touching the protrusion parts 44a to 44d with a finger, the operator can recognize the position of a finger on the frame member 52. The operator can select a desired protrusion part 44a to 44d with a touch of a finger and press the button image 69 on inner side of the protrusion part 44a to 44d. The operator can press the desired button image without viewing the screen of the display 62. In the example of FIG. 19 and FIG. 20, the protrusion parts 44a to 44d have shapes that are different from each other, but the embodiment is not limited to this. The plurality of protrusion parts having the same shape may be formed in the same way as the fourth frame member. The rest of the configuration, action, and effects of the eighth frame member are similar to those of the first frame member through the seventh frame member.

When a plurality of structure parts are formed on the frame member, the frame member may have a combination of protrusion parts formed on the front surface, recess parts formed on the front surface, protrusion parts formed on the outer surface, recess parts formed on the outer surface, protrusion parts projecting inward from the inner surface, and recess parts formed on the inner surface. For example, recess parts may be formed on the front surface of the left frame and protrusion parts may be formed on the outer surface of the right frame of the frame member.

Figure 21:
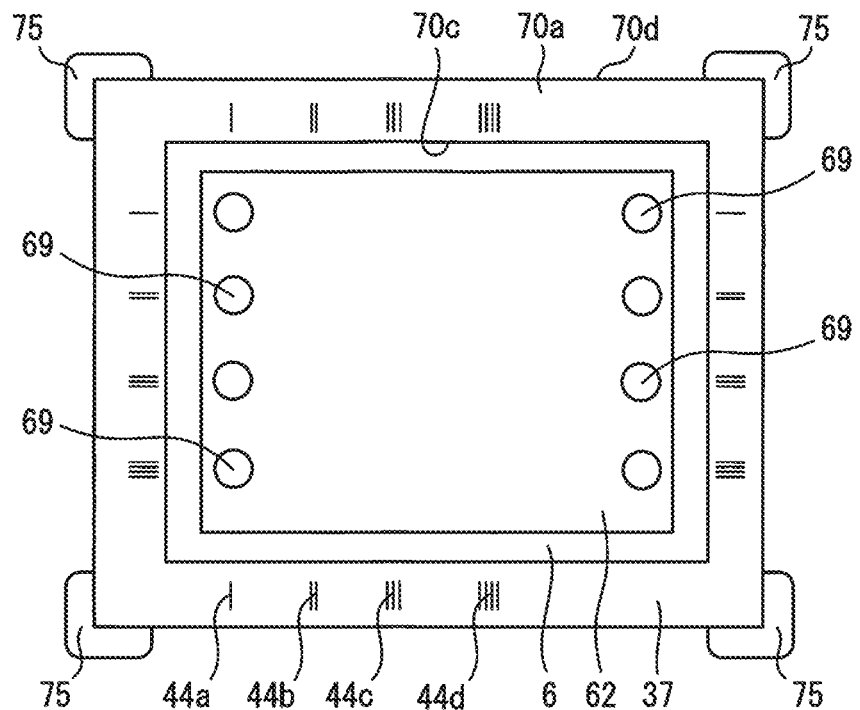
FIG. 21 is a plan view of a ninth frame member and the mobile terminal according to the embodiment.

FIG. 21 is a plan view of a ninth frame member and the mobile terminal according to the present embodiment. The ninth frame member 37 has a rectangular shape in a plan view. Shock absorbers 75 for absorbing shock are disposed at the corners of the ninth frame member 37 as viewed in a plan view. The shock absorber 75 is formed by elastic member. For example, the shock absorber 75 can be made of rubber, etc.

By arranging the shock absorbers 75 on the frame member, shock from the outside can be suppressed. Even if the frame member is bumped against a machine or the like, damage to the body of the frame member 37 and the mobile terminal 6 can be suppressed. The structure of the ninth frame member 37 is particularly suitable when the body of the frame member is made of a hard material.

In the ninth frame member 37, though the shock absorbers 75 are disposed at the corners, but the embodiment is not limited to this. The shock absorbers 75 may be disposed at any positions on the frame member. For example, the shock absorber may be disposed along the circumference of the body of the frame member so as to surround the circumference. Furthermore, the shock absorber can be arranged on any frame members according to the present embodiment.

Figure 22:
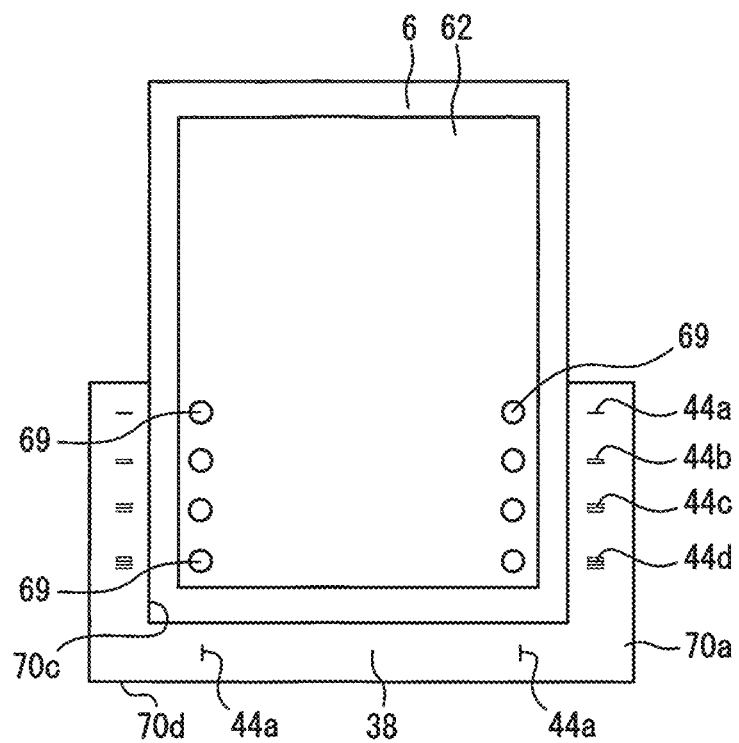
FIG. 22 is a plan view of a tenth frame member and the mobile terminal according to the embodiment.
Figure 23:
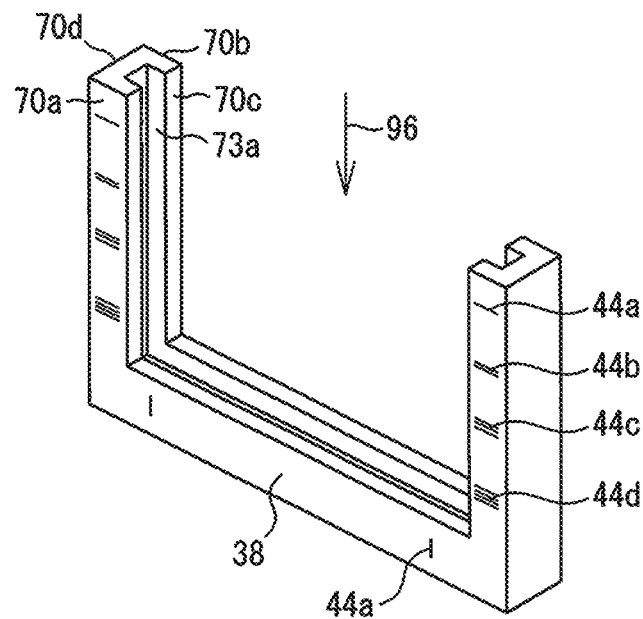
FIG. 23 is a perspective view of the tenth frame member.

FIG. 22 is a plan view of a tenth frame member and the mobile terminal according to the present embodiment. FIG. 23 is a perspective view of the tenth frame member according to the present embodiment. Referring to FIGS. 22 and 23, though the frame members described above are formed around the outer edge of the mobile terminal and contact the entirety of the outer edge thereof, the frame member is not limited to this configuration. The frame member may be formed so as to be in contact with at least a part of the outer edge of the mobile terminal. In other words, the frame member may be formed so as to partially cover the outer edge of the mobile terminal.

The tenth frame member 38 is formed so as to contact substantially half of the outer edge of the mobile terminal 6. The tenth frame member 38 also has a front surface 70a, a rear surface 70b, an inner surface 70c, and an outer surface 70d. Moreover, a groove 73a is formed on the inner surface 70c. The mobile terminal 6 is inserted into the groove 73a as indicated by arrow 96. A plurality of protrusion parts 44a to 44d are formed on the front surface 70a of the frame member 38. The display 62 of the mobile terminal 6 displays the button images 69 at positions corresponding to the positions of the protrusion parts 44a to 44d. The display 62 displays the button images 69 near the protrusion parts 44a to 44d. Thus, the frame member may be formed so as to partially support the outer edge of the mobile terminal.

Figure 24:
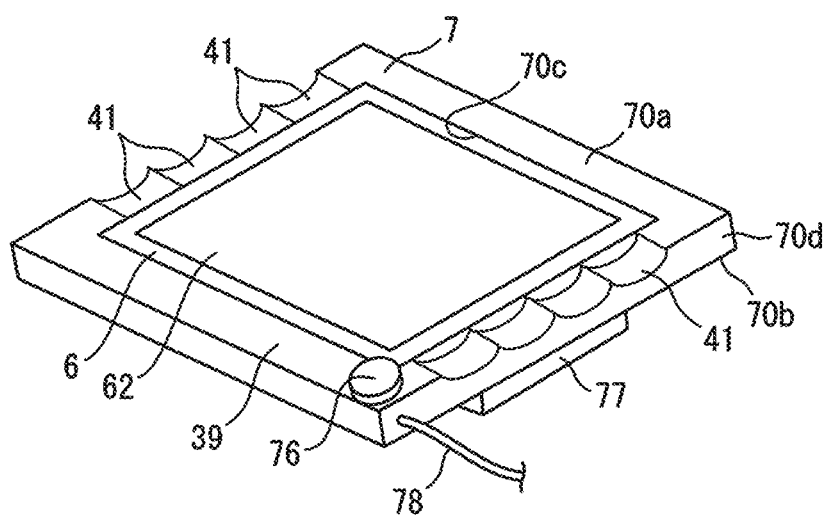
FIG. 24 is a perspective view of an eleventh frame member and the mobile terminal according to the embodiment.
Figure 25:
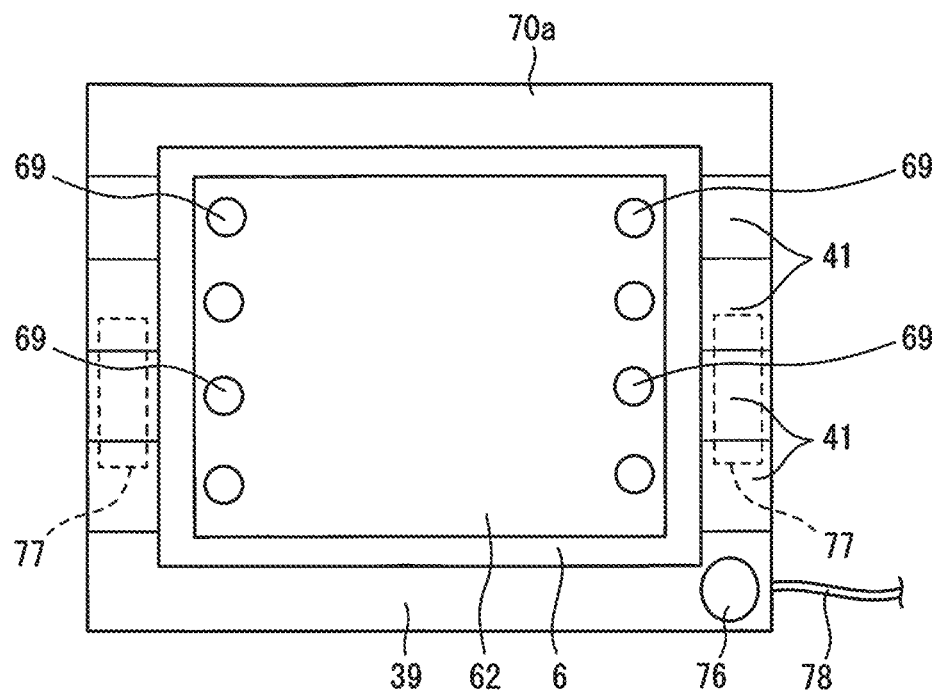
FIG. 25 is a plan view of the eleventh frame member and the mobile terminal.

FIG. 24 is a perspective view of an eleventh frame member and the mobile terminal according to the present embodiment. FIG. 25 is a plan view of an eleventh frame member and the mobile terminal according to the present embodiment. In the eleventh frame member 39, operation switches for operating the machine is arranged in the first frame member 31 of the present embodiment.

The eleventh frame member 39 includes an emergency stop button 76 and a dead man switch 77 as operation switches. The emergency stop button 76 is a button for quickly stopping the machine when the machine is driven. The dead man switch 77 is a switch enables machine operations when pressed. The operator can operate the machine in a period during which the dead man switch 77 is pressed.

In the eleventh frame member 39, the emergency stop button 76 is disposed on the front surface 70a of the frame member 39. The dead man switch 77 is disposed on the rear surface 70b of the frame member 39. The dead man switch 77 is disposed on the back side of an area where recess parts 41 are formed. In other words, the dead man switch 77 is disposed in a part gripped by the operator.

Figure 26:
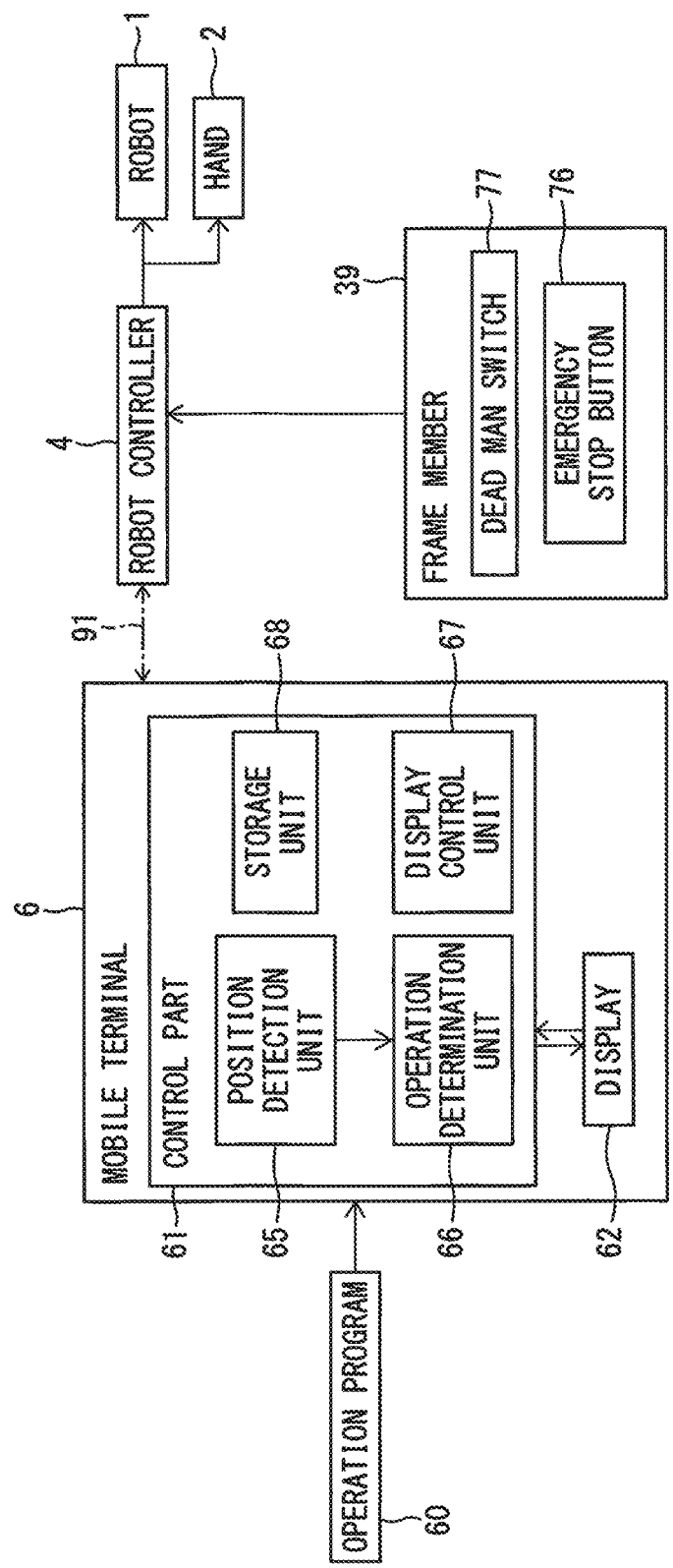
FIG. 26 is a block diagram of a robot device including the eleventh frame member according to the embodiment.

FIG. 26 is a block diagram showing a robot device including the eleventh frame member. Referring to FIGS. 24 to 26, the frame member 39 is connected to the robot controller 4 via a communication line 78. A signal indicating that the emergency stop button 76 or the dead man switch 77 has been pressed is transmitted to the robot controller 4 via the communication line 78. If the emergency stop button 76 is pressed, an emergency stop signal is transmitted to the robot controller 4. The robot controller 4 stops the driving of the robot 1 and the driving of the hand 2.

The signal indicating that the dead man switch 77 has been pressed is transmitted to the robot controller 4. When the dead man switch 77 is not pressed, the robot controller 4 stops the robot 1 and the hand 2. In a period during which the dead man switch 77 is pressed, the robot controller 4 drives the robot 1 and the hand 2 in response to an operation of the mobile terminal 6.

The eleventh frame member 39 of the present embodiment is connected to the robot controller 4 via the communication line 78. The signal from the frame member may be wirelessly transmitted to the robot controller 4. Alternatively, a connector port such as a USB (Universal Serial Bus) port may be formed in the frame member, and the frame member may be connected to the mobile terminal. In other words, the frame member may be formed so as to capable of communicating with the mobile terminal. In this case, the signals of the operation switches of the frame member can be transmitted to the robot controller via the mobile terminal. Alternatively, the frame member may be connected to the robot controller via the communication line. Furthermore, the mobile terminal is connected to the frame member via a USB port or the like. The mobile terminal and the robot controller may communicate with each other via the frame member. The operation switches for operating the machine can be disposed on any frame member according to the present embodiment.

Next, a computer program of the mobile terminal to which the frame member according to the present embodiment is attached will be described. Referring to FIGS. 2 and 26, an operation program 60 serving as a computer program is input to the mobile terminal 6. The operation program 60 is stored in the storage unit 68 serving as a storage medium. The storage unit 68 is, for example, a nonvolatile memory in which information is not erased even when a power supply is disconnected. The storage medium of the present embodiment is not a medium for temporarily recording information like carrier waves, but rather, is a non-temporary medium for recording information. The program recorded in the storage medium is readable by the computer.

The display control unit 67 of the control part 61 controls an image displayed on the display 62 based on the operation program 60. The position detection unit 65 of the control part 61 detects the position of a press of the operator on the screen of the display 62, based on the operation program 60. The position of the press on the screen of the display 62 is transmitted to the operation determination unit 66. The operation determination unit 66 determines the operation of the operator on the display 62, based on the operation program 60.

As described above, the display control unit 67 of the present embodiment displays button images for pressing by the operator at positions corresponding to the structure parts formed on the frame member. The computer program of the present embodiment is a program that causes a computer to display a button image. The positions of the button images are determined in advance. In the present embodiment, the button images are displayed on the end part of the screen of the display 62. When a plurality of frame members are used for a single mobile terminal, an operation program 60 can be formed for each of the frame members. Alternatively, the operation program 60 can be formed so as to capable of changing the images according to the type of the frame member.

The operation determination unit 66 determines the operation of the operator based on the output of the position detection unit 65. For example, the position detection unit 65 detects that the button image 69 has been pressed. The position detection unit 65 then detects that the press on the button image 69 has been released. The operation determination unit 66 determines whether or not the button image 69 is pressed and the press has been released within a predetermined time. When the button image 69 is pressed and the press has been released within the predetermined time, the operation determination unit 66 can determine that the button image 69 has been pressed.

The display 62 of the mobile terminal 6 according to the present embodiment displays the button images 69 near the structure parts perceivable with a finger touch. The control part 61 can be formed so as to perform the following first control and second control as the control for determining whether or not the button image 69 has been pressed. The computer program in this case is a program that causes the computer to perform the first control or the second control.

Figure 27:
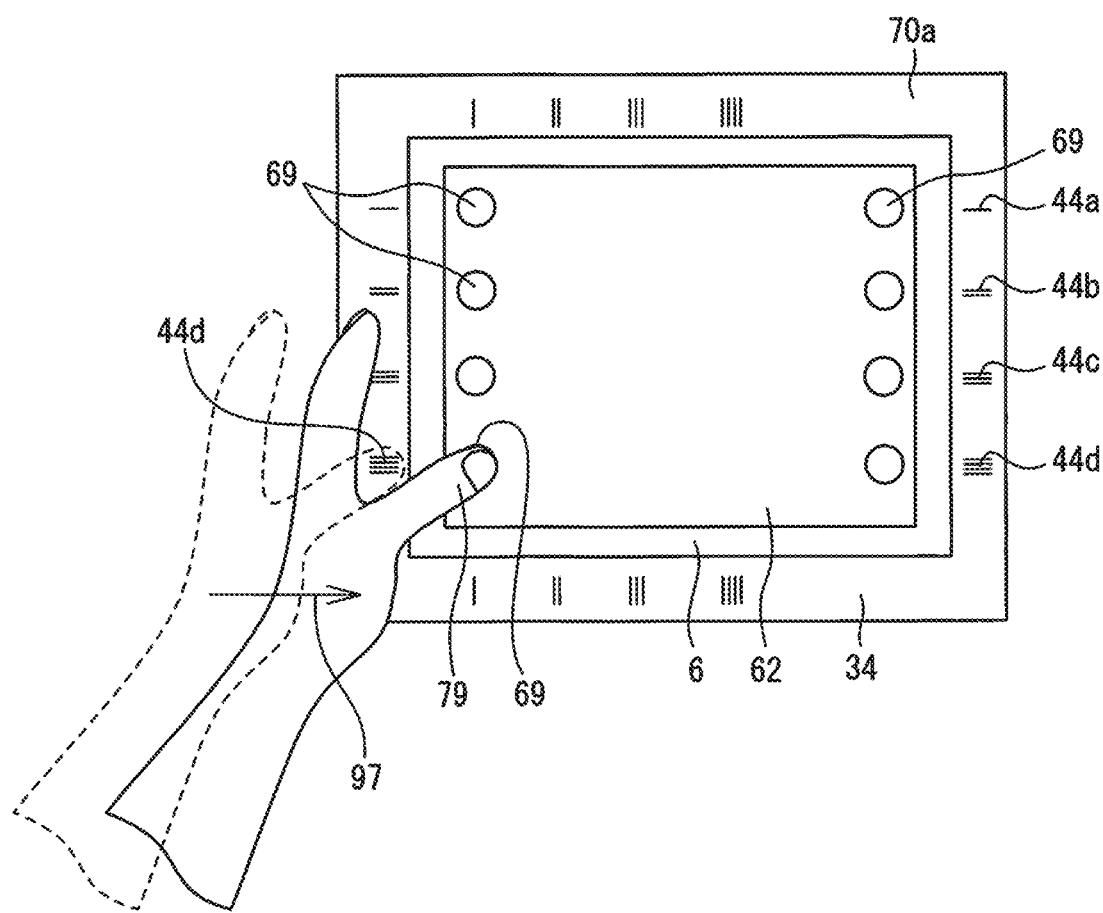
FIG. 27 is a plan view of the frame member and the mobile terminal when the mobile terminal is operated.

FIG. 27 is a plan view of the frame member and the mobile terminal when the mobile terminal is operated. Among the frame members of the present embodiment, the fourth frame member 34 will be described as an example.

Firstly, the operator selects a desired structure with a finger 79. In the example of FIG. 27, the operator selects the protrusion part 44*d* from among the protrusion parts 44*a* to 44*d* with the left thumb. Next, the operator moves the finger 79 along the longitudinal direction of the display 62 as indicated by arrow 97 without separating the finger 79 from the protrusion part 44*d*. The operator slides the finger 79 on the screen of the display 62 to the button image 69 corresponding to the protrusion part 44*d*. The finger 79 is moved while maintaining contact with the screen of the display 62. In the first control, when such an operation is performed, the control determination unit 66 determines that the button image 69 corresponding to the protrusion part 44*d* has been pressed.

The position detection unit 65 acquires the position pressed by the finger 79 at predetermined time intervals. The operation determination unit 66 determines whether or not the position of the press is moved from the area of the outer edge part of the display 62 corresponding to the position of the structure part to the button image 69. When the position of the press is moved from the area of the outer edge part of the display 62 to the button image 69, the operation determination unit 66 determines that the button image 69 displayed on the display 62 has been pressed.

Figure 28:
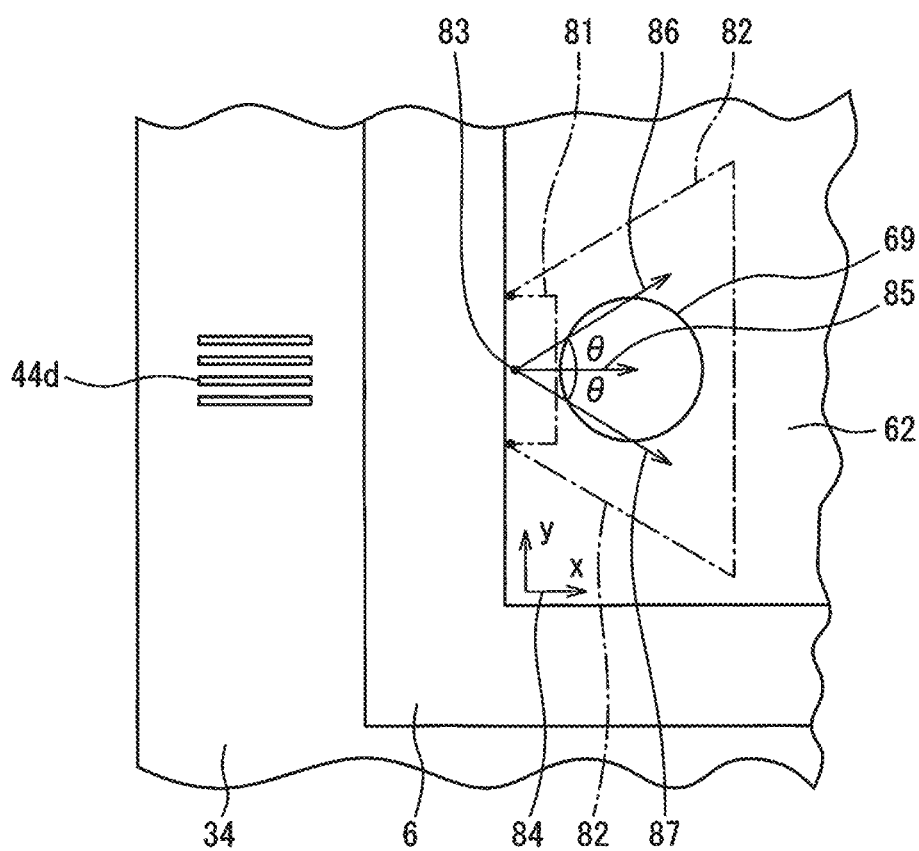
FIG. 28 is an enlarged plan view of the display of the mobile terminal.

FIG. 28 is an enlarged plan view of the mobile terminal and the fourth frame member according to the present embodiment. A screen coordinate system 84 including x-axis and y-axis is set on the screen of the display 62. The position detection unit 65 can detect the value of x coordinate and the value of y coordinate as the position pressed by the finger.

An initial area 81 is preset on the outer edge part of the screen of the display 62 on the side of the protrusion part 44*d*. The initial area 81 is an area for determining whether or not the operator slides a finger from the protrusion part 44*d* and the finger comes into contact with the screen. An initial pressing point 83 is a position where the position detection unit 65 first detects the press. If the initial pressing point 83 is disposed in the initial area 81, the operation determination unit 66 determines that a finger has slid from the protrusion part 44*d* and the finger has come into contact with the screen.

The position pressed by the operator preferably moves from substantially the center of the initial area 81 toward the center of the button image 69, as indicated by arrow 85. However, the finger may move in a direction which deviates from the direction indicated by arrow 85. In the present embodiment, the direction indicated by arrow 85 is set as a reference direction. Furthermore, a direction determination range is preset based on the reference direction. In this case, the reference direction is a direction that is parallel to the x-axis. The direction determination range is the range within an angle $\theta$ with respect to the reference direction. In other words, the determination range is a range interposed between arrow 86 and arrow 87. The reference direction and the determination range are stored in the storage unit 68.

The operation determination part 66 detects the movement direction of the position of a press from the initial pressing point 33. When the position of the press moves within the range of the angle $\theta$ with respect to the reference direction, the operation determination unit 66 determines that the position of the press is moving toward the button image 69. In this case, the operation determination unit 66 determines that the button image 69 has been pressed. Conversely, if the initial pressing point 83, at which a first press has been detected, is disposed outside the initial area 81 or if the position of a press moves in the direction that is outside of the determination range, the operation determination unit 66 determines that the button image 69 has not been pressed.

By executing the first control, it is not necessary to separate the finger from the frame member, and the button can be operated by moving the finger in parallel after selecting the structure part with the finger. As a result, the pressing of buttons other than a desired button by the operator can be suppressed. Moreover, the operator can operate the buttons in a short time. When the press is released after the button image is pressed from above, the control for determining that the button image has been pressed as described above can be prohibited. According to this control, when the button image is pressed from above by an erroneous operation by the operator, the control for determining that the button has been pressed can be avoided.

The determination of whether or not the position of the press on the display moves to the button image is not limited to the above mentioned control, and any control can be performed. For example, referring to FIG. 28, an area 82 extending from the initial area 81 can be set on the screen so as to correspond to the angle $\theta$. When the position of a press moves from the inside of the initial area 81 into the area 82 excluding the initial area 81, the operation determination unit 66 may determine that the position of the press has moved toward the button image.

Next, the second control will be described. In the second control, the operation determination unit 66 detects that the position of the press has moved from the area or the outer edge part of the display 62 corresponding to the position of the structure part toward the button image. This control is similar to the first control. In the second control, it is then determined whether or not the press has been released at the button image 69 or in an area near the button image 69. If the press has been released at the button image 69 or in the area near the button image 69, the operation determination unit 66 determines that the button image 69 displayed on the display 62 has been pressed.

Referring to FIG. 28, the operation determination unit 66 detects the movement direction of the position of a press from the initial pressing point 83. Furthermore, the operation determination unit 66 calculates a linear distance from the initial pressing point 83 to the position where the press has been released. A determination range is determined in advance for the linear distance from the initial pressing point 83 to the position where the press has been released. The determination range is stored in the storage unit 68. The operation determination unit 66 determines whether or not the position of the press has moved in the direction within the determination range of a predetermined angle. Moreover, the operation determination unit 66 determines whether or not the linear distance from the initial pressing point 83 to the position where the press was released is within the determination range. When the movement direction of the position of the press is within the determination range and when the movement distance of the position of the press is within the determination range, the operation determination unit 66 determines that the button image 69 has been pressed. Conversely, when the movement direction of the position of a press is outside the determination range or the movement distance of the position of the press is outside the determination range, the operation determination unit 66 determines that the button image 69 has not been pressed.

Thus, in the second control, when the operator slides a finger from the structure part toward the button image and the press is thereafter released at the button image or in the area near the button image, it is determined that the button image has been pressed. By adopting this control, determination of button operation can be carried out with higher accuracy than the first control.

The control for determining whether or not a press has been released at the button image 69 or in the area near the button image 69 is not limited to the above-mentioned control, and any other control can be performed. For example, referring to FIG. 28, the area 82 can be formed so as to be large enough to surround the button image 69. Moreover, an area other than the initial area 81 in the area 82 can be set as an area near the button image 69. When the press is released in the area other than the initial area 81 in the area 82 after the position of the press has moved from the initial area 81, the operation determination unit 66 can determine that the press has been released at the button image 69 or in the area near the button image 69. The area 82 can be preset in any shape so as to surround the button image 69. For example, an area that is apart from the button image 69 within a predetermined distance may be set as the area near the button image 69.

Though the machines operated by the operation device according to the present embodiment are the robot and the hand, the embodiment is not limited thereto. The embodiments described above can be applied to the operation device of any machine. For example, the frame member and the mobile terminal of the present embodiment can be applied to the operation device of a machine tool, the operation device of a conveyor, or the operation device of a crane.

Though the images displayed for pressing by the operator according to the present embodiment are buttons, the embodiment is not limited this. Any image for pressing by the operator can be displayed on the display. For example, the image on the display may be a slide bar that is moved after being pressed by the operator.

According to the frame member for the mobile terminal, the operation device for the machine, and the computer program of the embodiments of the present disclosure, the operation time in which the operator performs operations can be shortened.

In the foregoing controls, the orders of the steps can be optionally changed as long as the functions and effects are not modified.

The embodiments described above can be optionally combined. In the drawings, the same or equivalent part have been assigned the same reference numeral. The foregoing embodiments are merely exemplary and do not limit the invention. The embodiment includes the modifications described in the claims.

The invention claimed is:

1. A frame member for a mobile terminal, the frame member configured to be attached to the mobile terminal including a display of touch panel type, wherein
   the frame member is formed in contact with at least a part of an outer edge of the mobile terminal along a circumferential direction of the outer edge of the mobile terminal, and has a front surface on the same side as a screen of the display, a rear surface on the opposite side from the front surface, an inner surface in contact with the mobile terminal, and an outer surface on the opposite side from the inner surface,
   a structure part being perceivable with a finger touch is formed on at least one of the front surface, the inner surface, and the outer surface, the structure part being formed at a position corresponding to a predetermined image displayed on the display,
   the structure part is constituted by at least one of a protrusion part formed on the front surface, a recess part formed on the front surface, a protrusion part formed on the outer surface, a recess part formed on the outer surface, a protrusion part projecting inward from the inner surface, and a recess part formed on the inner surface, and
   the frame member is configured to be removable from the mobile terminal.

2. The frame member for the mobile terminal according to claim 1, wherein the frame member has a plurality of the structure parts, and
   the plurality of the structure parts have shapes that is formed according to a predetermined rule.

3. The frame member for the mobile terminal according to claim 2, wherein the plurality of the structure parts have shapes that are different from each other according to positions of the images displayed on the display.

4. The frame member for the mobile terminal according to claim 2, wherein the plurality of the structure parts are formed such that intervals between the structure parts gradually change according to positions of the images displayed on the display.

5. The frame member for the mobile terminal according to claim 1, further comprising an elastic shock absorber attached to the outer surface.

6. The frame member for the mobile terminal according to claim 1, further comprising an operation switch for operating a machine, wherein
   the operation switch is disposed on at least one of the front surface, the rear surface, and the outer surface.

7. An operation device for a machine, comprising:
   a mobile terminal for operating the machine; and
   a frame member attached to the mobile terminal; wherein
   the mobile terminal includes a display of touch panel type,
   the frame member is formed in contact with at least a part of an outer edge of the mobile terminal along a circumferential direction of the outer edge of the mobile terminal, and has a front surface on the same side as a screen of the display, a rear surface on the opposite side from the front surface, an inner surface in contact with the mobile terminal, and an outer surface on the opposite side from the inner surface, the mobile terminal is formed so as to display a predetermined image to be pressed by an operator on the display, a structure part being perceivable with a finger touch is formed on at least one of the front surface, the inner surface, and the outer surface, the structure part being formed at a position corresponding to the image displayed on the display, the structure part is constituted by at least one of a protrusion part formed on the front surface, a recess part formed on the front surface, a protrusion part formed on the outer surface, a recess part formed on the outer surface, a protrusion part projecting inward from the inner surface, and a recess part formed on the inner surface, and the frame member is configured to be removable from the mobile terminal.

8. A non-transitory computer readable storage medium storing thereon a computer program for causing, when executed by a mobile terminal having a display of touch panel type, the mobile terminal to determine a press on a screen of the display of touch panel type, wherein a frame member is attached to the mobile terminal, the frame member is formed in contact with at least a part of an outer edge of the mobile terminal along a circumferential direction of the outer edge of the mobile terminal, and has a front surface on the same side as the screen of the display, a rear surface on the opposite side from the front surface, an inner surface in contact with the mobile terminal, and an outer surface on the opposite side from the inner surface, a structure part being perceivable with a finger touch is formed on at least one of the front surface, the inner surface, and the outer surface of the frame member, the computer program causes the mobile terminal to display a predetermined image to be pressed by an operator, the predetermined image being disposed at a position corresponding to the structure part formed on the frame member, and the frame member is configured to be removable from the mobile terminal.

9. The storage medium according to claim 8, wherein the computer program cause the mobile terminal to determine whether or not a position of the press moves from an area of an outer edge part of the display corresponding to a position of the structure part to the image, and determine that the image displayed on the display is pressed when a position of the press moves from the area of the outer edge part of the display to the image.

10. The storage medium according to claim 8, wherein the computer program causes the mobile terminal to determine whether or not the press is released at the image or in an area near the image after a position of the press moves from an area of an outer edge part of the display corresponding to a position of the structure part to the image, and determine that the image displayed on the display is pressed when the press is released at the image or in an area near the image after a position of the press moves from an area of the outer edge part of the display to the image.

* * * * *